(12) United States Patent
Hara et al.

(10) Patent No.: US 6,939,621 B2
(45) Date of Patent: Sep. 6, 2005

(54) PLATED COPPER ALLOY MATERIAL AND PROCESS FOR PRODUCTION THEREOF

(75) Inventors: Toshihisa Hara, Shimonoseki (JP);
Yasuhiro Shintani, Shimonosaki (JP);
Masayasu Nishimura, Shimonosaki (JP);
Ryoichi Ozaki, Shimonosaki (JP);
Masahiro Kawaguchi, Shimonosaki (JP)

(73) Assignee: Kobe Steel, Ltd., Kobe (JP)

( * ) Notice: Subject to any disclaimer, the term of this patent is extended or adjusted under 35 U.S.C. 154(b) by 0 days.

(21) Appl. No.: 10/849,155

(22) Filed: May 20, 2004

(65) Prior Publication Data

US 2004/0209112 A1 Oct. 21, 2004

Related U.S. Application Data

(63) Continuation of application No. 10/207,027, filed on Jul. 30, 2002, now Pat. No. 6,759,142.

(30) Foreign Application Priority Data

Jul. 31, 2001 (JP) ......................................... 2001-232611
Jan. 29, 2002 (JP) ......................................... 2002-020526

(51) Int. Cl.$^7$ ........................... B32B 15/20; C25D 3/30; C25D 5/50

(52) U.S. Cl. ........................ 428/647; 428/648; 428/675; 428/929; 428/935; 205/176; 205/181; 205/182; 205/226; 439/886; 439/887

(58) Field of Search ................. 428/647, 648, 428/649, 675, 929, 935; 205/176, 181, 182, 241, 252, 225, 226; 439/887, 886

(56) References Cited

U.S. PATENT DOCUMENTS 1,750,092 A    3/1930   Crawford
3,247,082 A    4/1966   Rose
3,635,702 A    1/1972   Badia et al.

(Continued)

FOREIGN PATENT DOCUMENTS

| DE | 3712691 | 6/1988 |
|----|---------|--------|
| EP | 0 908 539 | 4/1999 |
| EP | 1 113 180 | 7/2001 |
| JP | 59-001666 | 1/1984 |
| JP | 60-147147 | 8/1985 |
| JP | 61-166994 | 7/1986 |
| JP | 61-177393 | 8/1986 |
| JP | 64-030122 | 2/1989 |
| JP | 64-030124 | 2/1989 |
| JP | 01-048355 | 10/1989 |

(Continued)

OTHER PUBLICATIONS

J.G. Henderson; Metallurgical Dictionary; Reinhold Publishing Corporation; 1953; pp. 32.

(Continued)

Primary Examiner—John J. Zimmerman
(74) Attorney, Agent, or Firm—Oblon, Spivak, McClelland, Maier & Neustadt, P.C.

(57) ABSTRACT

A plated copper alloy material for connecting terminals is provided which comprises a parent material of copper or copper alloy, a nickel layer and a copper-tin alloy layer. The nickel layer has a thickness of 0.1–1.0 μm. The copper-tin alloy layer has a thickness of 0.1–1.0 μm and contains 35–75 at % of copper. The material may additionally have a tin layer no thicker than 0.5 μm for an engaging type terminal containing 0.001–0.1 mass % of carbon, or thicker than 0.5 μm for a non-engaging type connector. The material meets requirements for capability of insertion with a small force, good electric reliability (due to low contact resistance) in a high-temperature atmosphere, workability for sharp bending without cracking, good solder wettability and good corrosion resistance to sulfur dioxide gas.

12 Claims, 1 Drawing Sheet

U.S. PATENT DOCUMENTS

| | | |
|---|---|---|
| 3,833,481 A | 9/1974 | Olson et al. |
| 3,892,637 A | 7/1975 | Polti |
| 3,954,420 A | 5/1976 | Hyner et al. |
| 4,131,517 A | 12/1978 | Mitsuo et al. |
| 4,167,459 A | 9/1979 | Lee et al. |
| 4,190,474 A | 2/1980 | Berdan et al. |
| 4,311,768 A | 1/1982 | Berdan et al. |
| 4,374,311 A | 2/1983 | Okahashi et al. |
| 4,394,419 A | 7/1983 | Konicek |
| 4,411,961 A | 10/1983 | Tremmel |
| 4,441,118 A | 4/1984 | Fister et al. |
| 4,498,121 A | 2/1985 | Breedis et al. |
| 4,525,434 A | 6/1985 | Morikawa et al. |
| 4,549,043 A | 10/1985 | Kalubowila et al. |
| 4,707,724 A | 11/1987 | Suzuki et al. |
| 4,736,236 A | 4/1988 | Butt |
| 4,882,236 A | 11/1989 | Smith et al. |
| 5,001,546 A | 3/1991 | Butt |
| 5,019,222 A | 5/1991 | Hino et al. |
| 5,021,300 A | 6/1991 | Stacey |
| 5,028,492 A | 7/1991 | Guenin |
| 5,114,543 A | 5/1992 | Kajiwara et al. |
| 5,268,235 A | 12/1993 | Lashmore et al. |
| 5,320,719 A | 6/1994 | Lashmore et al. |
| 5,320,919 A | 6/1994 | Azuma et al. |
| 5,384,204 A | 1/1995 | Yumoto et al. |
| 5,436,082 A | 7/1995 | Mathew |
| 5,486,721 A | 1/1996 | Herklotz et al. |
| 5,650,661 A | 7/1997 | Mathew |
| 5,780,172 A | 7/1998 | Fister et al. |
| 5,916,695 A | 6/1999 | Fister et al. |
| 6,183,885 B1 | 2/2001 | Nakamura et al. |
| 6,759,142 B2 * | 7/2004 | Hara et al. ............... 428/647 |
| 2002/0064677 A1 | 5/2002 | Moriuchi et al. |
| 2003/0129441 A1 | 7/2003 | Hara et al. |

FOREIGN PATENT DOCUMENTS

| | | |
|---|---|---|
| JP | 2-285091 | 11/1990 |
| JP | 03-039488 | 2/1991 |
| JP | 03-230509 | 10/1991 |
| JP | 06-073593 | 3/1994 |
| JP | 06-196349 | 7/1994 |
| JP | 6-196349 | 7/1994 |
| JP | 07-090674 | 4/1995 |
| JP | 07-150272 | 6/1995 |
| JP | 10-046363 | 2/1998 |
| JP | 10-60666 | 3/1998 |
| JP | 2001-203020 | 7/2001 |
| WO | WO 00/29647 | 5/2000 |

OTHER PUBLICATIONS

Paul C. Fazio et al.; "Metals Test Methods and Analytical Procedures"; 1993 Annual Book of ASTM Standards; vol. 03.0; pp. 478–481.

David B. Guralnik; "Second College Edition, Webster's New World Dictionary of the American Language"; pp. 1121.

Metals Handbook Desk Edition; American Society for Metals; 1985.

ASM Handbook Formerly Tenth Edition, Metals Handbook; "Properties and Selection: Nonferrous Alloys and Special-Purpose Materials"; vol. 2; 1990.

P.J. Kay et al.; "Barrier Layers Against Diffusion"; International Tin Research Institute, Greenford; Sep. 10, 1979; pp. 169–174.

J.K. Lim et al.; "Electroplated Palladium Coating As A Nickel Migration (Thermal) Barrier"; Plating & Surface Finishing; Mar. 1996; pp. 64–67.

Marjorie K. McGaughey; "Interdiffusion Between Tin Coatings and Copper–Nickel Alloy Substrates"; The Pennsylvania University, The Graduate School, Materials Science and Engineering; May 1993.

E.K. Ohriner; "Intermetallic Formulation in Soldered Copper–Based Alloys at 150° to 250° C."; Supplement to the Welding Journal; Jul. 1987.

* cited by examiner

F I G. 1
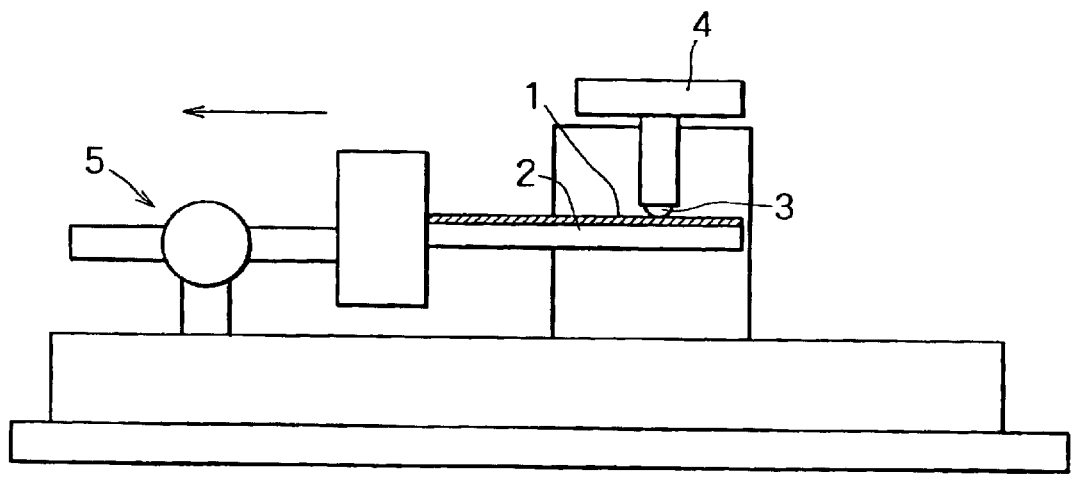

PLATED COPPER ALLOY MATERIAL AND PROCESS FOR PRODUCTION THEREOF

This application is continuation of U. S. application Ser. No. 10/207,027, filed Jul. 30, 2002, now U.S. Pat. No. 6,759,142 (issued Jul. 6, 2004), incorporated herein by reference, which claims the priority to Japanese Application No. 2002-020526, filed Jan. 29, 2002, and to Japanese Application No. 2001-232611, filed Jul. 31, 2001.

BACKGROUND OF THE INVENTION

1. Field of the Invention

The present invention relates to a plated copper alloy material as an electrically conductive material for connecting parts such as terminals, connectors and junction blocks, which are used for automobiles and consumer electric appliances.

2. Description of the Related Art

Connection of automotive wires is accomplished with tin-plated terminals of copper alloy. A pair of terminals (male and female) of engaging type constitute a connector. An assembly of such connectors is called a multipole connector.

The recent widespread use of electrical equipment in automobiles requires a single connector to have more terminals (or poles) than before. A connector with many poles needs a large physical force for insertion or even needs a special tool for insertion. This lowers the efficiency of assembling work. For this reason, there has been a demand for connectors which can be inserted with smaller forces than before even though the number of poles increases.

Tin-plated terminals permit insertion with smaller forces as the thickness of tin coating decreases. However, this advantage is lost when they are used for automobiles, in which most connectors have been removed from the cabin to the engine room in order to save the cabin space. The ambient temperature in the engine room reaches about 150° C. At such a high temperature, the thin tin-plating layer permits copper to diffuse from the copper parent material or (alloying element to diffuse from the copper-alloy parent material) or permits nickel to diffuse from the under-lying plating layer, to form an oxide on the surface of the tin-plating layer. This oxide increases the contact resistance of the terminals. The increased contact resistance makes electronic controllers to malfunction. In practice, therefore, it is difficult to reduce the thickness of the tin-plating layer while keeping electrical reliability.

Moreover, the tin-plating layer is subject to corrosion when automobiles are run or parked for a long time in industrial areas where air pollution with sulfur dioxide gas is prevailing. This corrosion reaches the copper alloy parent material, thereby impairing the reliability of the connecting terminals of engaging type.

A copper alloy material with a tin plating layer is used also as a conductive material in a junction block for an automobile. In implementation of electronics parts in the junction block, the material is required to undergo heat treatment at about 100° C. and further effect of heat by solder reflowing. Such conditions of heat do not exist in a conventional production process. Accordingly, the circumstances require a copper alloy material with a tin plating layer which maintains solder wettability after undergoing such heat effects. Furthermore, since the junction block is recently installed in an engine room instead of in a cabin in order to save space, the same problems as mentioned above arise.

A lead frame material with improved heat resistance is disclosed in Japanese Patent Laid-open No. 196349/1994. It consists of a parent material of nickel silver and a multi-layered coating film formed thereon by plating from nickel, copper-tin intermetallic compound, and tin. It was found that when the multi-layered coating film is formed on a copper alloy parent material according to the disclosure, the resulting terminals for engaging type need a large force for insertion, easily crack when bent sharply, or increase in contact resistance after reflowing.

In order to improve solder wettability, it is effective to make the thickness of a tin plating layer more than 2 $\mu$m which is thicker than that of a conventional material. However, electric reliability (a low contact resistance) can not be maintained after solder reflowing or after a long use in a high temperature only by controlling the thickness of a tin plating layer. Further, generation of pits in a tin plating layer can not be suppressed after reflowing process for producing a tin plated material.

SUMMARY OF THE INVENTION

The present invention was completed in view of the foregoing. It is an object of the present invention to provide an electrically conductive material for connecting parts which consists of a parent material of copper or copper alloy and a multi-layered coating film formed thereon by plating from nickel, copper-tin alloy, and tin, which does not crack even when bent sharply, keeps a low contact resistance after standing at high temperatures, has good corrosion resistance to sulfur dioxide gas, and shows good electrical reliability. The material for multi-pole connecting terminals of engaging type should provide also small insertion force. The material for connecting parts of non-engaging type such as a junction block should maintain solder wettability and prevent generation of pits, even after a heat treatment such as reflow soldering.

The present inventors tackled the problem involved in the copper or copper alloy material with plated surface layers which is used for electrically connecting parts.

The present invention is directed to a plated copper alloy material comprising a parent material of copper or copper alloy, a nickel layer formed on said parent material by plating which has a thickness of 0.1–1.0 $\mu$m and a copper-tin alloy layer which has a thickness of 0.1–1.0 $\mu$m formed on the nickel layer.

In the plated copper alloy, the copper-tin alloy layer contains preferably 35–75 at %, more preferably 45–65 at % of copper.

The plated copper alloy material may additionally have a tin layer having a thickness of less than or equal to 0.5 $\mu$m on said copper-tin alloy layer, wherein the tin layer preferably contains 0.001–0.1 mass % of carbon. This material is especially suitable for an engaging type terminal.

The plated copper alloy material may additionally have a tin layer having a thickness of 0.5 –2 $\mu$m on said copper-tin alloy layer. This material is especially suitable for a non-engaging type terminal.

A process for producing the plated copper alloy material may comprise coating a parent material of copper or copper alloy with a surface coating layer composed of a nickel layer of 0.1–1.0 $\mu$m thick, a copper layer of 0.1–0.3 $\mu$m thick, and a tin layer of 0.4–0.8 $\mu$m thick, wherein the surface coating layer is formed by plating sequentially in the order mentioned and performing heat treatment, thereby forming a copper-tin alloy layer, so that the surface coating layer is composed of the nickel layer, a copper-tin alloy layer, and a tin layer which remains on the copper-tin alloy layer.

In the process, the ratio of the thickness of said copper layer in the surface coating layer to the thickness of the tin layer in the surface coating layer is preferably 0.15–0.68.

In the process, the heat treatment is preferably re-flowing which is carried out at 230–600° C. for 3–30 seconds.

In the process, the nickel layer can be formed by electroplating with a current density of 3–20 A/dm$^2$, and the copper layer can be formed by electroplating with a current density of 2.5–10 A/dm$^2$ in a plating bath of copper sulfate at 30–40° C.

The material according to the present invention keeps good electric reliability (due to low contact resistance) in a high-temperature atmosphere, has good workability for sharp bending without cracking, and has good corrosion resistance to sulfur dioxide gas. Therefore, they keep good electric reliability when used at high temperatures as in the engine room. Connecting terminals of engaging type made of the material according to the present invention permit insertion with a small force and are useful for automotive multi-pole connectors because of easy male-female fitting and of efficient assembling. Connectors of non-engaging type made of the material according to the present invention maintain solder wettability even when a heat treatment is provided in an implementation process.

BRIEF DESCRIPTION OF THE DRAWING

FIG. 1 is a schematic diagram showing the jig used to measure the coefficient of kinetic friction.

DESCRIPTION OF THE PREFERRED EMBODIMENTS

A material according to the present invention comprises a parent material of copper or copper alloy, a nickel layer formed on the parent and a copper-tin alloy layer formed on the nickel layer. A tin layer is optionally formed on the copper-tin alloy layer.

The nickel layer is designed to improve corrosion resistance to sulfur disulfide gas. With a thickness smaller than 0.1 μm, the nickel layer has pit defects through which sulfur dioxide gas reacts with copper as the major constituent of the parent material. Therefore, such a thin nickel layer is not effective in protecting the parent material from corrosion and can not be practically used. Moreover, such a thin nickel layer permits copper (or alloy component) of the parent material to diffuse through the thin nickel layer into the copper-tin alloy layer, thereby forming an oxide on the surface of the copper-tin alloy layer. When the tin layer exists, the thin nickel layer permits copper of the parent material to diffuse through the thin nickel layer further into the tin layer, thereby forming an oxide on the surface of the tin layer. Such an oxide increases contact resistance. On the other hand, with a thickness larger than 1.0 μm, the nickel layer is liable to cracking in the bending process. This deterio-rates the formability of terminal pins. Consequently, the thickness of the nickel layer should be 0.1–1.0 μm, preferably 0.1–0.5 μm.

The copper-tin alloy layer as a constituent of the surface plating layer prevents nickel from diffusing from the nickel layer to the copper-tin alloy layer and to the tin layer. With a thickness smaller than 0.1 μm, the copper-tin alloy layer is not effective in preventing diffusion; it permits nickel to diffuse to the surface of the copper-tin alloy layer or the tin layer. The diffused nickel forms an oxide to increase contact resistance, thereby deteriorating electrical reliability. With a thickness larger than 1.0 μm, the copper-tin alloy layer is liable to cracking in the bending process. This deteriorates the formability of terminal pins, consequently, the thickness of the copper-tin alloy layer should be 0.1–1.0 μm, preferably 0.1–0.5 μm. In the present invention, the copper-tin alloy layer may include a slight amount of nickel, because a slight amount of nickel is diffused into the copper-tin alloy layer in some cases.

With a copper content lower than 35 at %, the copper-tin alloy layer is not effective in preventing nickel diffusion. With a copper content higher than 75 at %, the copper-tin alloy layer is so hard as to deteriorate bending properties. The hard copper-tin alloy layer also makes the tin layer formed thereon hard. Therefore, the copper-content of the copper-tin alloy layer should be 35–75 at %, preferably 45–65 at %. The copper content can be obtained by wet analysis wherein the whole copper-tin alloy layer is melted. As an easier manner, the copper content can be obtained by the use of such a measuring instrument as ESCA-LAB210D, after removing the outermost tin layer and performing argon etching.

The tin layer as a constituent of the surface plating layer remains as the uppermost layer after the copper-tin alloy layer has been formed by the, process mentioned later. The use of the material, for example, for an engaging type terminal and for a non-engaging type connector, depends on the thickness of the tin layer.

In a material according to the present invention for an engaging type terminal, the tin layer imparts corrosion resistance to the terminal pins. The tin layer should be thicker than 0.1 μm in order to provide enough corrosion resistance. However, an excessively thick tin layer has a high coefficient of kinetic friction which makes multi-pole connectors to require great forces for insertion. Therefore, the tin layer should be thinner than 0.5 μm. Thus, the thickness of the tin layer should be in the range of 0.1 to 0.5 μm. However, without the tin layer, the material can be used for an engaging type terminal.

In a material according to the present invention for a non-engaging type terminal, the tin layer provides high electric reliability by maintaining a low contact resistance and good solder wettability. However, the thickness of the tin layer more than 2 μm enhances generation of pits on the surface after reflowing treatment and deteriorates corrosion resistance. On the other hand, the thickness of the tin layer less than 0.5 μm deteriorates solder wettability. Therefore, the thickness of the tin layer should be in the range of 0.2 to 2 μm, more preferably 1 to 2 μm.

In both of the uses, the tin layer should contain carbon in an amount ranging from 0.001 to 0.1 mass %. This is dictated mainly by the manufacturing process. Carbon in an amount less than 0.001 mass % does not ensure the macro-throwing power (uniform tin electrodeposition). This leads to a poor appearance after reflowing. Carbon in an amount more than 0.1 mass % partly separates out on the tin layer after reflowing. This leads to an increased contact resistance. Incidentally, the carbon content in the tin layer may be controlled by the amount of brightening agent and additive in the plating bath and the plating current density.

In a material according to the present invention for an engaging type terminal, the surface plating layer constructed as mentioned above is characterized-by a low coefficient of kinetic friction (below 0.45), a low contact resistance (below 100 mΩ) after standing at high temperatures, and good bending workability, as shown in examples given later.

In a material according to the present invention for a non-engaging type connector, the surface plating layer constructed as mentioned above is characterized by a low solder wetting time (below 1.5 seconds), a low contact resistance (below 100 mΩ) after standing at high temperatures, and good bending workability, as shown in examples given later.

The above-mentioned surface plating layer can be obtained by coating a copper or copper alloy parent material sequentially with a nickel plating layer, a copper plating layer and a tin plating layer, and heating the coated material, thereby forming a copper-tin alloy layer. This heat treatment extinguishes the copper plating layer, while permitting the tin layer to remain on the outermost surface. The copper-tin alloy layer is an intermetallic compound-and composed entirely or mainly of η phase and partly of ε phase. After the heat treatment, the surface plating layer comprises a nickel plating layer of 0.1–1.0 μm thick, a copper-tin alloy layer of 0.1–1.0 μm thick and a tin layer of 0–0.5 μm or 0.5–2 μm thick. In the case where the copper plating layer is thick, ε phase can be generated on the boundary between the tin plating layer and copper plating layer. Since too much amount of ε phase increases hardness of the copper-tin alloy layer and deteriorates bending workability, the ratio of the amount of ε phase to that of the whole copper-tin alloy layer should be less than 30%. Observing etched cross section of the plating layer under a scanning electron microscope can distinguish η phase and ε phase, because they are different in composition and crystal construction. The copper plating layer should be extinguished, because the copper plating layer which remains after the heat treatment causes peeling at the boundary between the nickel plating layer and the copper-tin alloy layer in a high-temperature atmosphere.

The process of producing a material for an engaging type terminal according to the present invention (thickness of tin layer after heat treatment: less than or equal to 0.5 μm) should be carried out so that a copper or copper alloy parent material sequentially is coated with a nickel plating layer (0.1–1.0 μm thick), a copper plating layer (0.1–0.45 μm thick), and a tin plating layer 0.4–1.1 μm thick) containing 0.001–0.1 mass % of carbon, and the coated material undergo a heat treatment. The heat treatment is preferably reflowing which is carried out at 230–600° C. for 3–30 seconds.

In the process, with a thickness of copper plating layer smaller than 0.1 μm, the copper plating layer does not form the copper-tin alloy layer after heating which is thick enough to prevent nickel from diffusing from the underlying nickel layer to the tin phase. With a thickness larger than 0.45 μm, the copper plating layer partly remains underneath the copper-tin alloy layer which is formed after heating. This deteriorates corrosion resistance. In addition, an excessively thick copper plating layer causes peeling after standing at high temperatures. Therefore, the thickness of the copper plating layer should be 0.1–0.45 μm, preferably 0.1–0.3 μm, more preferably 0.1–0.25 μm from the standpoint of stable quality.

In the process, the tin plating layer should have a prescribed thickness. With a thickness smaller than 0.4 μm, the tin plating layer will have an uneven mat surface after heating. With a thickness larger than 1.1 μm, the tin plating layer remains thick even after heating depending on the thickness of the copper plating layer, deteriorating the effect of reducing the coefficient of kinetic friction. Therefore, the thickness of the tin plating layer should be in the range of 0.4–1.1 μm, preferably 0.4–0.8 μm.

The thickness of the copper plating layer and the thickness of the tin plating layer should be such that their ratio is from 0.15 to 0.41. If this ratio is smaller than 0.15, the copper-tin alloy layer does not grow sufficiently upon heat treatment. Thus the resulting copper-tin alloy layer does not completely prevent nickel from diffusing from the underlying nickel layer. This results in a high contact resistance (upon standing at high temperature). And if the ratio is smaller than 0.15, the resulting tin layer is too thick to prevent a high coefficient of kinetic friction. If this ratio is larger than. 0.41, the copper-tin alloy layer grows close to the surface upon heat treatment. The result is that the remaining tin layer is thin (less than 0.1 μm) and poor in corrosion resistance and that the tin layer has surface irregularities which impair the appearance (surface gloss) and increase the contact resistance.

Only when this thickness ratio is smaller than 0.41, the surface layer is free of irregularities and has a surface gloss higher than 60% after heat treatment. Since the process of the present invention requires the tin plating layer to be very thin (0.4–1.1 μm, preferably 0.4–0.8 μm), it is necessary to control the copper/tin thickness ratio within the range specified above so that the copper-tin alloy layer and the tin layer have the prescribed thickness after heat treatment and contribute to the good appearance, good corrosion resistance, and low contact resistance.

The process of producing a material for a non-engaging type connector according to the present invention (thickness of tin layer after heat treatment: more than 0.5 μm and less than 2 μm) should be carried out so that a copper or copper alloy parent material sequentially is coated with a nickel plating layer (0.1–1.0 μm thick), a copper plating layer (0.1–0.45 μm thick), and a tin plating layer 1.1–2.5 μm thick) containing 0.001–0.1 mass % of carbon, and the coated material undergo a heat treatment.

In the process of producing materials for both of the uses, in the case where heat treatment is reflowing, the temperature of heating should be 230–600° C. and the duration of heating should be 3–30 seconds. With a heating temperature lower than 230° C., reflowing does not melt tin; with a heating temperature higher than 600° C., reflowing softens the copper or copper alloy parent material, resulting in distortion. With a heating duration shorter than 3 seconds, reflowing causes uneven heat transfer, making the surface look irregular after reflowing. With a heating duration longer than 30 seconds, reflowing promotes oxidation on the surface tin layer, thereby increasing contact resistance. This reflowing treatment forms the copper-tin alloy layer, grows plating grains, reduces plating stress, and inhibits the growth of whiskers. For the copper-tin alloy layer to grow uniformly, it is desirable to carry out heat treatment at a temperature lower than 300° C. with a small amount of heat just enough to melt tin.

In the process of producing materials for both of the uses, all of the nickel plating layer, copper plating layer, and tin plating layer should preferably be formed by electroplating on the parent material of copper or copper alloy. Electroless plating, though applicable, causes the plating film to capture the reducing agent, which leads to voids after standing at high temperatures.

Electroplating for the nickel plating layer should preferably be carried out in a watts nickel bath or a nickel sulfamate plating bath at 40–55° C. with a current density of 3–20 A/dm$^2$. What is important in nickel plating is current density. With a current density lower than 3 A/dm$^2$, nickel plating lacks macrothrowing power and good productivity. With a current density higher than 20 A/dm$^2$, nickel plating results in coarse grains.

Electroplating for the copper plating layer usually employs a copper cyanide plating bath. However, a copper sulfate plating bath is preferable because it does not contaminate the tin plating bath with cyanide and it does not pose a problem with waste water disposal. On the other hand, a copper sulfate plating bath does not permit uniform plating (due to uneven deposition). Moreover, it is usually incorporated with a brightening agent. Incorporation of a brightening agent into the plating bath is not practicable in the case where copper plating is followed by tin plating and heat treatment is performed afterward, because the plating layer formed in this manner permits voids to increase after standing at high temperatures.

Since the present invention requires the copper plating layer to be thin within a narrow range, uniform plating is essential. If the copper plating layer varies in thickness (due mainly to coarse grains as mentioned later), the copper-tin alloy layer does not grow uniformly after heat treatment, which leads to poor surface brightness and inadequate characteristic properties. Especially in a material for an engaging type terminal, the tin plating layer is also required to be thin within a narrow range. Therefore, the problem becomes more severe.

With the foregoing in mind, the present inventors studied the method for uniform copper plating with a copper sulfate plating bath free of brightening agent. As the result, it was found that it is possible to perform uniform copper plating with controlled grain size under the following plating conditions. For copper plating on nickel plating as in the present invention, the temperature of the plating bath should be 30–40° C. and the current density should be 2.5–10 A/dm$^2$.

Copper plating at a temperature higher than 40° C. results in coarse copper grains which hinder uniform plating. (Coarse grains hinder uniform plating because the present invention requires the copper plating layer to be very thin.) On the other hand, copper plating at a temperature lower than 30° C. lacks uniform deposition although it poses no problem with coarse grains. In addition, copper plating with a current density lower than 2.5 A/dm$^2$ or higher than 10 A/dm$^2$ results in coarse grains which hinder uniform plating.

The outermost tin plating layer should be formed by electroplating with a tin sulfate plating bath at a temperature lower than 25° C. and with a current density of 2–10 A/dm$^2$.

The production method explained above for a material according to the present invention is based on a method wherein a copper or copper alloy parent material is coated sequentially with a nickel plating layer, a copper plating layer and a tin plating layer, and the coated material undergo heat treatment to form a copper-tin alloy layer. Alternatively, it is possible to form a copper-tin alloy plating layer on the nickel plating layer and then forming thereon an optional tin plating layer.

EXAMPLES

Example 1

Each sample was prepared from a 0.30 mm thick sheet of copper alloy parent material (C2600) by sequential plating with nickel, copper, and tin, in the specified thickness. Their plating baths and plating conditions are shown in Tables 1 to 3. The thickness of each plating layer and the thickness ratio of the copper and tin plating layers are shown in Table 4. (For sample Nos. 1 to 15) The thickness of each plating layer was measured in the following manners.

[Measurement of Thickness of Tin Layer and Nickel Layer]

Measured by using a fluorescent X-ray thickness gauge, Model SFT156A, from Seiko Denshi Kogyo Co., Ltd.

[Measurement of Thickness of Copper Layer]

A specimen prepared by a microtome from each sample was observed under a scanning electron microscope, and its average thickness was calculated by image processing.

TABLE 1

| Composition of nickel plating bath | Concentration |
| --- | --- |
| $NiSO_4 \cdot 6H_2O$ | 240 g/L |
| $NiCl_2 \cdot 6H_2O$ | 30 g/L |
| $H_3BO_3$ | 30 g/L |
| Conditions of nickel plating | |
| Current density | 5 A/dm$^2$ |
| Temperature | 45° C. |

TABLE 2

| Composition of copper plating bath | Concentration |
| --- | --- |
| $CuSO_4$ | 250 g/L |
| $H_2SO_4$ | 80 g/L |
| Cl | 30 mg/L |
| Conditions of copper plating | |
| Current density | 5 A/dm$^2$ |
| Temperature | 30° C. |

TABLE 3

| Composition of tin plating bath | Concentration |
| --- | --- |
| $SnSO_4$ | 50 g/L |
| $H_2SO_4$ | 80 g/L |
| Cresolsulfonic acid | 30 g/L |
| Brightening agent | 10 g/L |
| Conditions of tin plating | |
| Current density | 3 A/dm$^2$ |
| Temperature | 15° C. |

TABLE 4

| | Layer construction | | | | Carbon | Condition of heat treatment | |
| --- | --- | --- | --- | --- | --- | --- | --- |
| Sample No. | Thickness of Ni layer (μm) | Thickness of Cu layer (μm) | Thickness of Sn layer (μm) | Ratio of thickness Cu/Sn | content in Sn layer (mass %) | Temperature of heat treatment (° C.) | Duration of heat treatment (seconds) |
| 1 | 0.15 | 0.25 | 0.7 | 0.36 | 0.05 | 280 | 10 |
| 2 | 0.8 | 0.25 | 0.7 | 0.36 | 0.05 | 280 | 10 |
| 3 | 0.3 | 0.1 | 0.4 | 0.25 | 0.05 | 280 | 10 |

TABLE 4-continued

| Sample No. | Layer construction | | | | Carbon content in Sn layer (mass %) | Condition of heat treatment | |
|---|---|---|---|---|---|---|---|
| | Thickness of Ni layer (μm) | Thickness of Cu layer (μm) | Thickness of Sn layer (μm) | Ratio of thickness Cu/Sn | | Temperature of heat treatment (° C.) | Duration of heat treatment (seconds) |
| 4 | 0.3 | 0.45 | 1.1 | 0.41 | 0.05 | 280 | 10 |
| 5 | 0.3 | 0.25 | 0.7 | 0.36 | 0.05 | 250 | 10 |
| 6 | 0.3 | 0.25 | 0.7 | 0.36 | 0.05 | 650 | 10 |
| 7 | 0.3 | 0.25 | 0.5 | 0.5 | 0.05 | 280 | 10 |
| 8 | 0.3 | 0.25 | 0.9 | 0.28 | 0.05 | 280 | 10 |
| 9 | 0.05 | 0.25 | 0.7 | 0.36 | 0.05 | 280 | 10 |
| 10 | 1.2 | 0.25 | 0.7 | 0.36 | 0.05 | 280 | 10 |
| 11 | 0.3 | 0.025 | 0.25 | 0.1 | 0.05 | 280 | 10 |
| 12 | 0.3 | 0.6 | 1.4 | 0.43 | 0.05 | 280 | 10 |
| 13 | 0.3 | 0.25 | 0.7 | 0.36 | 0.05 | 230 | 10 |
| 14 | 0.3 | 0.25 | 0.7 | 0.36 | 0.05 | 650 | 10 |
| 15 | 0.3 | 0.25 | 1.1 | 0.23 | 0.05 | 280 | 10 |

The plated sheet underwent reflowing treatment under different conditions as shown in Table 4. Thus, there were obtained samples shown in Table 5. Each sample was measured for thicknesses of the layers, copper content in copper-tin alloy layer and carbon content in the tin layer in the following manners. In addition, each sample was evaluated about external appearance and tested for coefficient of kinetic friction, contact resistance after standing at high temperatures, corrosion resistance to sulfur dioxide gas, and bending workability. The results are shown in Table 5.

[Measurement of Thickness of Tin Layer]

Each sample was measured for the thickness of the tin plating layer by using a fluorescent X-ray thickness gauge, Model SFT156A, from Seiko Denshi Kogyo Co., Ltd. Subsequently, each sample was dipped in a solution containing p-nitrophenol and sodium hydroxide for 10 minutes so that the tin layer peeled off. Each sample was measured for the tin content in the copper-tin alloy layer by using the fluorescent X-ray thickness gauge. The true thickness of the tin layer is calculated by subtracting the tin content in the copper-tin alloy layer from the thickness of the tin plating layer measured first.

[Measurement of Thickness of Copper-tin Alloy Layer]

Each sample was dipped in the above mentioned solution so that the tin layer peeled off. After that, each sample was measured for the thickness of the copper-tin alloy plating layer by using a fluorescent X-ray thickness gauge.

[Measurement of Thickness of Nickel Layer]

Each sample was measured for the thickness of the nickel plating layer directly by using a fluorescent X-ray thickness gauge.

TABLE 5

| Sample No. | Layer construction after reflowing treatment | | | | Appearance after reflowing treatment | Coefficient of kinetic friction ($\mu_k$) | Contact resistance after standing at high temperatures (mΩ) | Corrosion resistance to sulfur dioxide gas after standing at high temperatures | Bending workability |
|---|---|---|---|---|---|---|---|---|---|
| | Thickness of Ni layer (μm) | Thickness of Cu-Sn layer (μm) | Content copper in Cu-Sn layer (at %) | Thickness of Sn layer (μm) | | | | | |
| 1 | 0.15 | 0.5 | 55 | 0.2 | ○ | 0.40 | 60 | ○ | ○ |
| 2 | 0.8 | 0.5 | 55 | 0.2 | ○ | 0.40 | 70 | ○ | ○ |
| 3 | 0.3 | 0.2 | 55 | 0.2 | ○ | 0.40 | 100 | ○ | ○ |
| 4 | 0.3 | 0.9 | 55 | 0.2 | ○ | 0.40 | 70 | ○ | ○ |
| 5 | 0.3 | 0.5 | 50 | 0.2 | ○ | 0.42 | 90 | ○ | ○ |
| 6 | 0.3 | 0.5 | 70 | 0.2 | ○ | 0.40 | 70 | ○ | ○ |
| 7 | 0.3 | 0.5 | 55 | 0 | X | 0.39 | 90 | ○ | ○ |
| 8 | 0.3 | 0.5 | 55 | 0.4 | ○ | 0.45 | 40 | ○ | ○ |
| 9 | 0.05 | 0.5 | 55 | 0.2 | ○ | 0.41 | 50 | X | ○ |
| 10 | 1.2 | 0.5 | 55 | 0.2 | ○ | 0.41 | 70 | ○ | X |
| 11 | 0.3 | 0.05 | 55 | 0.2 | ○ | 0.43 | 500 | ○ | ○ |
| 12 | 0.3 | 1.2 | 55 | 0.2 | ○ | 0.40 | 50 | ○ | X |
| 13 | 0.3 | 0.5 | 30 | 0.2 | ○ | 0.42 | 250 | ○ | ○ |
| 14 | 0.3 | 0.5 | 80 | 0.2 | ○ | 0.40 | 60 | ○ | X |
| 15 | 0.3 | 0.5 | 55 | 0.6 | ○ | 0.50 | 30 | ○ | ○ |

Remarks: Underlined figures are outside the range specified in the invention or represent poor properties.

[Measurement of Copper Content in Copper-tin Alloy Layer]

Each sample was dipped in a solution containing p-nitrophenol and sodium hydroxide for 10 minutes so that the outermost tin layer peeled off. The surface of each sample was cleaned of contaminants and oxides by argon etching to a depth of 300 Å. The copper content in the copper-tin alloy layer was determined by ESCA with LAB210D (from VG company).

[Measurement of Carbon Content in Tin Layer]

A first specimen is prepared from each sample which has undergone reflowing treatment. A second specimen is prepared from said first specimen by treatment with 5% nitric acid for removal of the outermost tin layer. These specimens are burnt at a high temperature in an oxygen stream and carbon dioxide and carbon monoxide evolved by them are analyzed by infrared absorption. The amount of carbon (in mass %) in the tin layer is obtained from the difference between the two values thus determined. The amount of carbon in the tin layer after reflowing treatment can be estimated as the same amount as that before reflowing treatment. Incidentally, it is possible to determine the carbon content in this manner even though the thickness of the tin layer is found to be zero by calculation. Even in this case, there remain some tin layers and the carbon content in them can be determined.

[Measurement of Coefficient of Kinetic Friction]

An apparatus as shown in FIG. 1 was built to simulate the contact between terminal pins of engaging type. A flat test piece 1 (representing the male) cut out of the sample was fixed to the horizontal base 2. On the flat test piece 1 was placed a semispherical test piece 3 (representing the female) 1.5 mm in radius, so that the two test pieces were in contact with each other. The female test piece 3 was pressed against the male test piece 1 under a load (weight 4) of 3.0 N. The male test piece 1 was pulled in the horizontal direction (at a rate of 80 mm/min) by using a horizontal load tester, Model 2152 from Aiko Engineering Co., Ltd. The maximum frictional force (F) in the slide distance of 5 mm was recorded. Incidentally, the reference number 5 denotes a load cell, and the arrow indicates the direction of sliding. The coefficient of kinetic friction was calculated from the following equation (1), wherein P is the amount of the load.

$$\text{Coefficient of friction} = F/P \qquad (1)$$

[Measurement of Contact Resistance After Standing at High Temperatures]

After heat treatment in the atmosphere at 160° C. for 120 hours, each specimen was measured for contact resistance by the four-probe method at an open-circuit voltage of 20 mV and a current of 10 mA, without sliding.

[Bending Workability]

A test piece was cut out of each sample such that its longitudinal direction coincides with the rolling direction. The test piece was bent at a right angle to the rolling direction under a load of $9.8 \times 10^3$ N by using a bending test jig specified in JIS H3110. The bent test piece was cut by using a microtome and the cross section was observed. The sample was rated as good (○) if it suffered cracking in the bent part, with the copper alloy parent material remaining intact. The sample was rated as poor (X) if it suffered cracking not only in the bent part but also in the copper alloy parent material.

[Corrosion Resistance to Sulfur Dioxide Gas]

Before testing, samples were allowed to stand at 160° C. for 120 hours in imitation of actual use conditions. The test consisted of placing the sample in the air containing 25 ppm of sulfur dioxide gas at 35° C. and 75% RH for 96 hours. By observation of the cross section, the sample was rated as good (○) if no corrosion was noticed in the parent material. The sample was rated as poor (X) if corrosion deeper than 1 μm was noticed in the parent material.

[Evaluation of External Appearance]

After reflow treatment, the surface of the tin layer was measured for mirror reflectivity. The sample was rated as good (○) if the surface gloss was higher than 60%. The sample was rated as poor (X) if the surface gloss was lower than 60%.

The following are noted from Table 5. Samples Nos. 1 to 8 have the layer construction meeting the requirement of the present invention. All of them have a coefficient of kinetic friction lower than 0.45, a contact resistance lower than 100 nΩ after standing at high temperatures, good bending workability and good corrosion resistance to sulfur dioxide gas. However, only Sample No. 7, in which the outermost tin layer disappears, are poor in external appearance after reflowing.

In contrast, Sample No. 9, which has a nickel plating layer thinner than specified, is poor in corrosion resistance to sulfur dioxide gas. Sample No. 10, which has a nickel plating layer thicker than specified, is poor in bending workability. Sample No. 11, which has a copper-tin alloy layer thinner than specified, has a high contact resistance. Sample No. 12, which has a copper-tin alloy layer thicker than specified, is poor in bending workability. Sample No. 13, which has a copper-tin alloy layer containing less copper than specified, has a high contact resistance. Sample No. 14, which has a copper-tin alloy layer containing more copper than specified, is poor in bending workability. Sample No. 15, which has a tin layer thicker than specified, has a high coefficient of kinetic friction.

Example 2

In the same way as in Example 1, each sample was prepared from a 0.30 mm thick sheet of copper alloy parent material (C2600) by sequential plating with nickel, copper, and tin, in the specified thickness. Their plating baths and plating conditions are shown in Table 1 for nickel, Table 6 for copper and Table 3 (The amount of brightening agent was changed within 0–10 g/l.) for tin. The thicknesses of the plating layers and the thickness ratio of the copper and tin plating layers are shown in Table 7. (For sample Nos. 16 to 39) The thicknesses of the plating layers were measured in the same manner as in Example 1.

TABLE 6

| Composition of copper plating bath | Concentration |
| --- | --- |
| $CuSO_4$ | 250 g/L |
| $H_2SO_4$ | 80 g/L |
| Cl | 30 mg/L |
| Conditions of copper plating | |
| Current density | 3.5 A/dm$^2$ |
| Temperature | 30° C. |

TABLE 7

| Sample No. | Layer construction | | | | Carbon content in tin layer (mass %) | Condition of heat treatment | |
|---|---|---|---|---|---|---|---|
| | Thickness of Ni layer (μm) | Thickness of Cu layer (μm) | Thickness of Sn layer (μm) | Ratio of thickness Cu/Sn | | Temperature of heat treatment (° C.) | Duration of heat treatment (seconds) |
| 16 | 0.15 | 0.15 | 0.5 | 0.30 | 0.05 | 280 | 10 |
| 17 | 0.8 | 0.15 | 0.5 | 0.30 | 0.05 | 280 | 10 |
| 18 | 0.3 | 0.10 | 0.5 | 0.20 | 0.05 | 280 | 10 |
| 19 | 0.3 | 0.30 | 0.8 | 0.38 | 0.05 | 280 | 10 |
| 20 | 0.3 | 0.15 | 0.4 | 0.38 | 0.05 | 280 | 10 |
| 21 | 0.3 | 0.15 | 0.8 | 0.19 | 0.05 | 280 | 10 |
| 22 | 0.3 | 0.15 | 0.5 | 0.30 | 0.005 | 280 | 10 |
| 23 | 0.3 | 0.15 | 0.5 | 0.30 | 0.10 | 280 | 10 |
| 24 | 0.3 | 0.15 | 0.5 | 0.30 | 0.05 | 270 | 10 |
| 25 | 0.3 | 0.15 | 0.5 | 0.30 | 0.05 | 350 | 10 |
| 26 | 0.3 | 0.15 | 0.5 | 0.30 | 0.05 | 280 | 5 |
| 27 | 0.3 | 0.15 | 0.5 | 0.30 | 0.05 | 280 | 15 |
| 28 | 0.05 | 0.15 | 0.5 | 0.30 | 0.05 | 280 | 10 |
| 29 | 1.2 | 0.15 | 0.5 | 0.30 | 0.05 | 280 | 10 |
| 30 | 0.3 | 0.05 | 0.5 | 0.10 | 0.05 | 280 | 10 |
| 31 | 0.3 | 0.50 | 0.5 | 1.00 | 0.05 | 280 | 10 |
| 32 | 0.3 | 0.15 | 0.1 | 1.50 | 0.05 | 280 | 10 |
| 33 | 0.3 | 0.15 | 1.0 | 0.15 | 0.05 | 280 | 10 |
| 34 | 0.3 | 0.15 | 0.5 | 0.30 | 0.0005 | 280 | 10 |
| 35 | 0.3 | 0.15 | 0.5 | 0.30 | 0.5 | 280 | 10 |
| 36 | 0.3 | 0.15 | 0.5 | 0.30 | 0.05 | 200 | 10 |
| 37 | 0.3 | 0.15 | 0.5 | 0.30 | 0.05 | 650 | 10 |
| 38 | 0.3 | 0.15 | 0.5 | 0.30 | 0.05 | 280 | 1 |
| 39 | 0.3 | 0.15 | 0.5 | 0.30 | 0.05 | 280 | 40 |

The plated sheet underwent reflowing treatment under different conditions as shown in Table 7. Thus, there were obtained samples as shown in Table 8. Each sample was measured for layer thickness and carbon content in the tin layer in the same manner as in Example 1. In addition, each sample was evaluated about external appearance and tested for coefficient of kinetic friction, contact resistance after standing at high temperatures, corrosion resistance to sulfur dioxide gas, and bending-workability. The results are shown in Table 8.

[Measurement of Thickness of Nickel Layer, Copper-tin Alloy Layer, and Tin Layer]

A specimen prepared by a microtome from each sample was observed under a scanning electron microscope, and its average thickness was calculated by image processing. The observation was done in magnification of 10000. The average thickness was obtained from results of twelve points, i.e. the center, the upper end and the lower end of three positions in the width direction of a cross section of a sample, the front and back sides of a sample, and the first and last of a plating.

TABLE 8

| Sample No. | Layer construction after reflowing treatment | | | | Appearance after reflowing treatment | Coefficient of kinetic friction ($\mu_k$) | Contact resistance after standing at high temperatures (mΩ) | Corrosion resistance to sulfur dioxide gas after standing at high temperatures | Bending workability |
|---|---|---|---|---|---|---|---|---|---|
| | Thickness of Ni layer (μm) | Thickness of Cu—Sn alloy layer (μm) | Content copper in Cu—Sn layer (at %) | Thickness of Sn layer (μm) | | | | | |
| 16 | 0.15 | 0.3 | 55 | 0.2 | ○ | 0.40 | 30 | ○ | ○ |
| 17 | 0.8 | 0.3 | 55 | 0.2 | ○ | 0.40 | 50 | ○ | ○ |
| 18 | 0.3 | 0.2 | 55 | 0.3 | ○ | 0.43 | 100 | ○ | ○ |
| 19 | 0.3 | 0.6 | 55 | 0.2 | ○ | 0.40 | 70 | ○ | ○ |
| 20 | 0.3 | 0.3 | 55 | 0.1 | ○ | 0.40 | 70 | ○ | ○ |
| 21 | 0.3 | 0.3 | 55 | 0.5 | ○ | 0.45 | 20 | ○ | ○ |
| 22 | 0.3 | 0.3 | 55 | 0.2 | ○ | 0.40 | 20 | ○ | ○ |
| 23 | 0.3 | 0.3 | 55 | 0.2 | ○ | 0.40 | 90 | ○ | ○ |
| 24 | 0.3 | 0.3 | 55 | 0.2 | ○ | 0.40 | 30 | ○ | ○ |
| 25 | 0.3 | 0.3 | 55 | 0.2 | ○ | 0.40 | 30 | ○ | ○ |
| 26 | 0.3 | 0.3 | 55 | 0.2 | ○ | 0.40 | 30 | ○ | ○ |
| 27 | 0.3 | 0.3 | 55 | 0.2 | ○ | 0.40 | 30 | ○ | ○ |
| 28 | 0.05 | 0.3 | 55 | 0.2 | ○ | 0.40 | 50 | X | ○ |
| 29 | 1.2 | 0.3 | 55 | 0.2 | ○ | 0.40 | 70 | ○ | X |
| 30 | 0.3 | 0.09 | 55 | 0.4 | ○ | 0.43 | 500 | ○ | ○ |
| 31 | 0.3 | 1.0 | 75 | 0 | X | 0.40 | peel | ○ | ○ |
| 32 | 0.3 | 0.25 | 80 | 0 | X | 0.40 | 300 | ○ | ○ |
| 33 | 0.3 | 0.3 | 55 | 0.7 | ○ | 0.48 | 40 | ○ | ○ |

TABLE 8-continued

| | Layer construction after reflowing treatment | | | | | Contact resistance after standing at high temperatures (mΩ) | Corrosion resistance to sulfur dioxide gas after standing at high temperatures | |
|---|---|---|---|---|---|---|---|---|
| Sample No. | Thickness of Ni layer (μm) | Thickness of Cu—Sn alloy layer (μm) | Content copper in Cu—Sn layer (at %) | Thickness of Sn layer (μm) | Appearance after reflowing treatment | Coefficient of kinetic friction ($\mu_k$) | | Bending workability |
| 34 | 0.3 | 0.3 | 55 | 0.2 | X | 0.43 | 100 | ○ | ○ |
| 35 | 0.3 | 0.3 | 55 | 0.2 | ○ | 0.40 | <u>400</u> | ○ | ○ |
| 36 | 0.3 | 0.2 | <u>30</u> | 0.4 | X | 0.43 | 100 | ○ | ○ |
| 37 | 0.3 | 0.4 | 40 | <u>0</u> | X | 0.40 | <u>300</u> | ○ | ○ |
| 38 | 0.3 | 0.2 | <u>20</u> | 0.4 | X | 0.43 | 100 | ○ | ○ |
| 39 | 0.3 | 0.4 | 40 | <u>0</u> | X | 0.40 | <u>500</u> | ○ | ○ |

Remarks: Underlined figures are outside the range specified in the invention or represent poor properties The following are noted from Tables 7 and 8. Samples Nos. 16 to 27, which have the layer construction (before reflowing) meeting the requirement of the present invention, give the surface plating layer (after reflowing) meeting the requirement of the present invention (The thicknesses of the layers are nickel:0.1–1.0 μm, copper-tin alloy: 0.1–1.0 μm and tin: less than or equal to 0.5 μm). All of them have a coefficient of kinetic friction lower than 0.45, a contact resistance lower than 100 mΩ after standing at high temperatures, and good bending workability, good corrosion resistance to sulfur dioxide gas and good external appearance after reflowing.

Sample No. 28, which has a nickel plating layer thinner than specified, is poor in corrosion resistance to sulfur dioxide gas. Sample No. 29, which has a nickel plating layer thicker than specified, is poor in bending workability. Sample No. 30, which has a copper plating layer thinner than specified, causes reflowing to form a thin copper-tin alloy layer which leads to a high contact resistance. Sample No. 31, which has a copper plating layer thicker than specified, has a poor appearance after reflowing and suffers peeling after standing at high temperatures. The reason for the peeling is that a copper plating layer partially remains just beneath the copper-tin alloy layer. Sample No. 32, which has a tin plating layer thinner than specified and has a copper content in a copper-tin alloy layer higher than specified, causes reflowing to grow a copper-tin alloy layer up to the surface and a copper-concentrated layer on the surface, which leads to a high contact resistance and a poor appearance (due to low surface gloss). Sample No. 33, which has a tin plating layer thicker than specified, permits the tin plating layer to remain after reflowing, which leads to a high coefficient of kinetic friction. Sample No. 34, which contains less carbon in the tin layer than specified, has a poor appearance after reflowing. Sample No. 35, which contains more carbon in the tin layer than specified, has a high contact resistance. For Samples Nos. 36 to 39, reflowing is carried out under the condition (temperature and duration) not meeting the requirement. In Samples Nos. 36 and 38, for which enough reflowing is not carried out due to low temperature or short duration, the appearances are poor and the copper plating layer may still remain. In Samples Nos. 37 and 39, for which reflowing is carried out in excessively high temperature or for excessively long duration, the appearances are poor and diffusion of nickel causes high contact resistance.

Example 3

The same parent material (sheet) as in Example 2 was sequentially coated with a nickel plating layer (0.3 μm thick), a copper plating layer (0.15 μm thick), and a tin plating layer (0.5 μm thick). The plating conditions are basically the same as in Example 2, except that the current density was varied for the nickel plating layer and the temperature and current density were varied for the copper plating layer, both as shown in Table 8. The resulting samples (Nos. 40 to 50) were examined for macrothrowing power of plating. The results are shown in Table 9.

[Macrothrowing Power]

The surface and cross section of the plating player (which had not yet undergone reflowing) was examined under a scanning electron microscope. Samples were rated as good (○) if copper grains are smaller than 0.25 μm in average diameter. Samples were rated as poor (X) if copper grains are larger than 0.25 μm in average diameter. There is a relationship between the grain size and the plating thickness. Plating layer with fine grains has-a uniform thickness. Plating layer with coarse grains has an uneven thickness.

The plating process was followed by reflowing treatment at 280° C. for 10 seconds. Thus, there were obtained the desired samples Nos. 40 to 50.

TABLE 9

| Sample No. | Current density for Ni plating layer (A/dm²) | Plating temperature for Cu layer (° C.) | Current density for Cu plating layer (A/dm²) | Macrothrowing power (grain size) |
|---|---|---|---|---|
| 40 | 5.0 | 30 | 3.5 | ○ |
| 41 | 5.0 | 35 | 3.0 | ○ |
| 42 | 15.0 | 35 | 3.5 | ○ |
| 43 | 5.0 | 35 | 7.0 | ○ |
| 44 | 5.0 | 40 | 4.0 | ○ |
| 45 | <u>1.0</u> | 35 | 3.5 | X |
| 46 | <u>25.0</u> | 35 | 3.5 | X |

TABLE 9-continued

| Sample No. | Current density for Ni plating layer (A/dm²) | Plating temperature for Cu layer (° C.) | Current density for Cu plating layer (A/dm²) | Macrothrowing power (grain size) |
|---|---|---|---|---|
| 47 | 5.0 | <u>20</u> | 3.5 | X |
| 48 | 5.0 | <u>45</u> | 3.5 | X |
| 49 | 5.0 | 35 | <u>1.0</u> | X |
| 50 | 5.0 | 35 | <u>12.0</u> | X |

Remarks: Underlined figures are outside the range specified in the invention.

The following are noted from Table 9. Samples Nos. 40 to 44 have fine grains and macrothrowing power. They have the copper-tin alloy layer uniformly grown by reflowing treatment. After reflowing treatment, the nickel layer was 0.3 μm thick, the copper-tin alloy layer was 0.3 μm thick, and the tin layer was 0.2 μm thick. They have a coefficient of kinetic friction lower than 0.45, a contact resistance lower than 100 mΩ after standing at high temperatures, and good corrosion resistance to sulfur dioxide gas.

By contrast, sample No. 45, in which the current density for the nickel layer is lower than specified, has an uneven nickel layer under the strong influence of the parent material. This leads to an uneven copper layer and a high contact resistance. Sample No. 46, in which the current density for the nickel layer is higher than specified, has a nickel layer with coarse grains. This leads to a copper layer with coarse grains and a high contact resistance. Sample No. 47, in which the copper plating temperature is lower than specified, sample No. 48, in which the copper plating temperature is higher than specified, sample No. 49, in which the copper plating current density is lower than specified, and sample No. 50, in which the copper plating current density is higher than specified, have a copper layer with coarse grains and varied thickness. This causes reflowing treatment to grow the copper-tin alloy layer unevenly, and leads to a high contact resistance.

If a sample in which the copper layer has coarse grains (larger than 0.25 μm in diameter) undergoes reflowing treatment, the copper-tin alloy layer reaches the surface and takes on an abnormal structure. This is found by observation for the cross section.

Example 4

In the same way as in Example 1, each sample was prepared from a 0.30 mm thick sheet of copper alloy parent material (C2600) by sequential plating with nickel, copper, and tin, in the specified thickness. Their plating baths and plating conditions are shown in Tables 1 to 3. The thicknesses of the plating layers and the thickness ratio of the copper and tin plating layers are shown in Table 10. (For sample Nos. 51 to 66) The thicknesses of the plating layers were measured in the same manner as in Example 1.

TABLE 10

| | Layer construction | | | | Condition of heat treatment | |
|---|---|---|---|---|---|---|
| Sample No. | Thickness of Ni layer (μm) | Thickness of Cu layer (μm) | Thickness of Sn layer (μm) | Carbon content in Sn layer (mass %) | Temperature of heat treatment (° C.) | Duration of heat treatment (seconds) |
| 51 | 0.15 | 0.25 | 1.5 | 0.05 | 280 | 10 |
| 52 | 0.8 | 0.25 | 1.5 | 0.05 | 280 | 10 |
| 53 | 0.3 | 0.1 | 1.2 | 0.05 | 280 | 10 |
| 54 | 0.3 | 0.45 | 1.9 | 0.05 | 280 | 10 |
| 55 | 0.3 | 0.25 | 1.5 | 0.05 | 250 | 10 |
| 56 | 0.3 | 0.25 | 1.5 | 0.05 | 650 | 10 |
| 57 | 0.3 | 0.25 | 1.1 | 0.05 | 280 | 10 |
| 58 | 0.3 | 0.25 | 2.5 | 0.05 | 280 | 10 |
| 59 | 0.05 | 0.25 | 1.5 | 0.05 | 280 | 10 |
| 60 | 1.2 | 0.25 | 1.5 | 0.05 | 280 | 10 |
| 61 | 0.3 | 0.025 | 1.05 | 0.05 | 280 | 10 |
| 62 | 0.3 | 0.6 | 2.2 | 0.05 | 280 | 10 |
| 63 | 0.3 | 0.25 | 1.5 | 0.05 | 230 | 10 |
| 64 | 0.3 | 0.25 | 1.5 | 0.05 | 650 | 10 |
| 65 | 0.3 | 0.25 | 0.8 | 0.05 | 280 | 10 |
| 66 | 0.3 | 0.25 | 3.5 | 0.05 | 280 | 10 |

The plated sheet underwent reflowing treatment under different conditions as shown in Table 10. Thus, there were obtained samples shown in Table 11. Each sample was measured for layer thickness and carbon content in the tin layer in the same manner as in Example 1. In addition, each sample was evaluated about external appearances and tested for solder wettability in the following manner. Further, each sample was tested for contact resistance after standing at high temperatures, corrosion resistance to sulfur dioxide gas, and bending workability in the same manner as in Example 1. The results are shown in Table 11.

[Evaluation of External Appearance]

After reflowing treatment, the surface of each sample was observed. The sample was rated as good (○) if generation of pits was not observed. The sample was rated as poor (X) if generation of pits was observed. At the same time, in the same manner as in Example 1, the surfaces of the samples were measured for mirror reflectivity. All the samples rated as good have mirror reflectivity over 60% and all the samples rated as poor have mirror reflectivity less than 60%.

[Evaluation of Solder Wettability]

The samples were heated in the atmosphere at 250° C. for 5 minutes, assuming reflow soldering for implementation of electronics parts. After that, the samples were cut into pieces of 10 mm×30 mm so that the longitudinal direction coincides with the direction perpendicular to the rolling direction. The pieces were dipped in non-active flux (α-100, by Japan Alfametals Ltd.) for one second. The pieces were measured for solder wetting time by using a solder checker (SAT-5100 type) as an evaluation of solder wettability.

TABLE 11

| | Layer construction after reflowing treatment | | | | | Contact resistance after standing at high temperatures (mΩ) | Corrision resistance to sulfur dioxide gas after standing at high temperatures | |
|---|---|---|---|---|---|---|---|---|
| Sample No. | Thickness of Ni layer (μm) | Thickness of Cu—Sn layer (μm) | Content of copper in Cu—Sn layer (at %) | Thickness of Sn layer (μm) | Appearance after reflowing treatment | Solder wetting time after heated (sec) | | Bending workability |
| 51 | 0.15 | 0.5 | 55 | 1.0 | ○ | 1.0 | 2.5 | ○ | ○ |
| 52 | 0.8 | 0.5 | 55 | 1.0 | ○ | 1.0 | 5.5 | ○ | ○ |
| 53 | 0.3 | 0.2 | 55 | 1.0 | ○ | 1.0 | 5.5 | ○ | ○ |
| 54 | 0.3 | 0.9 | 55 | 1.0 | ○ | 1.0 | 2.5 | ○ | ○ |
| 55 | 0.3 | 0.5 | 50 | 1.0 | ○ | 1.1 | 2.5 | ○ | ○ |
| 56 | 0.3 | 0.5 | 70 | 1.0 | ○ | 1.0 | 15 | ○ | ○ |
| 57 | 0.3 | 0.5 | 55 | 0.6 | ○ | 1.2 | 5 | ○ | ○ |
| 58 | 0.3 | 0.5 | 55 | 2.0 | ○ | 0.9 | 1.5 | ○ | ○ |
| 59 | 0.05 | 0.5 | 55 | 1.0 | ○ | 1.0 | 100 | X | ○ |
| 60 | 1.2 | 0.5 | 55 | 1.0 | ○ | 1.0 | 2.0 | ○ | X |
| 61 | 0.3 | 0.05 | 55 | 1.0 | ○ | 1.0 | 500 | ○ | ○ |
| 62 | 0.3 | 1.2 | 55 | 1.0 | ○ | 1.0 | 2.5 | ○ | X |
| 63 | 0.3 | 0.5 | 30 | 1.0 | ○ | 1.0 | 200 | ○ | ○ |
| 64 | 0.3 | 0.5 | 80 | 1.0 | ○ | 1.0 | 2.5 | ○ | X |
| 65 | 0.3 | 0.5 | 55 | 0.3 | ○ | 2.5 | 10 | ○ | ○ |
| 66 | 0.3 | 0.5 | 55 | 3.0 | X | 0.9 | 2.5 | ○ | ○ |

Remarks: Underlined figures are outside the range specified in the invention or represent poor properties.

The following are noted from Table 11. Samples Nos. 51 to 58 have the layer construction meeting the requirement of the present invention. All of them have a good external appearance of tin plating layer after reflowing, a solder wetting time lower than 1.5 seconds, a contact resistance lower than 100 mΩ after standing at high temperatures, good bending workability and good corrosion resistance to sulfur dioxide gas.

In contrast, Sample No. 59, which has a nickel plating layer thinner than specified, is poor in corrosion resistance to sulfur dioxide gas. Sample No. 60, which has a nickel plating layer thicker than specified, is poor in bending workability. Sample No. 61, which has a copper-tin alloy layer thinner than specified, has a high contact resistance. Sample No. 62, which has a copper-tin alloy layer thicker than specified, is poor in bending workability. Sample No. 63, which has a copper-tin alloy layer containing less copper than specified, has a high contact resistance. Sample No. 64, which has a copper-tin alloy layer containing more copper than specified, is poor in bending workability. Sample No. 65, which has a tin layer thinner than specified, has a long solder wetting time of 2.5 seconds. Sample No. 66, which has a tin layer thicker than specified, is poor in appearance because of pits generated on the surface.

We claim:

1. A plated copper alloy material comprising:
   a parent material of copper or copper alloy;
   a nickel layer formed on the parent material by plating, wherein the nickel layer has a thickness of 0.1–1.0 μm;
   a copper-tin alloy layer formed on the nickel layer, wherein the copper-tin alloy layer has a thickness of 0.1–1.0 μm; and
   a tin layer having a thickness ranging from 0.5 μm to 2 μm on the copper-tin alloy layer, wherein the tin layer contains 0.001–0.1 mass % of carbon and wherein said tin layer thickness is measured after heat treatment.

2. The plated copper alloy material of claim 1, wherein the tin layer has a thickness of greater than 0.5 μm.

3. The plated copper alloy material of claim 1, wherein the copper-tin alloy layer contains 35–75 at % of copper.

4. The plated copper alloy material of claim 3, wherein the copper-tin alloy layer contains 45–65 at % of copper.

5. The plated copper alloy material of claim 1, wherein the copper-tin alloy layer comprises η phase, and optionally ε phase.

6. A process for producing the plated copper alloy material of claim 1, comprising:
   coating a parent material of copper or copper alloy with a surface coating layer comprising a nickel layer of 0.1–1.0 μm thickness, a copper layer of 0.1–0.45 μm thickness, and a tin layer of 1.1–2.5 μm thickness, and wherein the surface coating layer is formed by the sequential formation of the nickel, copper and tin layers, and wherein the surface coating layer is heat treated to form a copper-tin alloy layer.

7. The process of claim 6, wherein the sequential formation of the nickel layer, copper layer and tin layer is done by electroplating each layer.

8. The process of claim 6, wherein the surface coated layer is heat treated by reflowing at a temperature within the range of 230–600° C.

9. The process of claim 8, wherein the surface coated layer is heat treated for 3–30 seconds.

10. The process of claim 6, wherein the nickel layer is formed by electroplating with a current density of 3–20 A/dm$^2$.

11. The process of claim 6, wherein the copper layer is formed by electroplating with a current density of 2.5–10 A/dm$^2$ in a copper sulfate plating bath.

12. The process of claim 6, wherein the tin layer is formed by electroplating with a current density of 2–10 A/dm$^2$ in a tin sulfate plating bath.

* * * * *

UNITED STATES PATENT AND TRADEMARK OFFICE
CERTIFICATE OF CORRECTION

PATENT NO. : 6,939,621 B2
DATED : September 6, 2005
INVENTOR(S) : Hara et al.

It is certified that error appears in the above-identified patent and that said Letters Patent is hereby corrected as shown below:

<u>Title page,</u>
Item [73], Assignee, should read -- Kabushiki Kaisha Kobe Seiko Sho (Kobe Steel, Ltd.), Kobe (JP) --.

Signed and Sealed this

Twenty-second Day of November, 2005

JON W. DUDAS
*Director of the United States Patent and Trademark Office*